(12) United States Patent
Stokes et al.

(10) Patent No.: US 9,948,272 B2
(45) Date of Patent: Apr. 17, 2018

(54) AIR GAP IN BAW TOP METAL STACK FOR REDUCED RESISTIVE AND ACOUSTIC LOSS

(71) Applicant: TriQuint Semiconductor, Inc., Hillsboro, OR (US)

(72) Inventors: Paul Stokes, Orlando, FL (US); Gernot Fattinger, Sorrento, FL (US)

(73) Assignee: Qorvo US, Inc., Greensboro, NC (US)

( * ) Notice: Subject to any disclaimer, the term of this patent is extended or adjusted under 35 U.S.C. 154(b) by 226 days.

(21) Appl. No.: 15/059,789

(22) Filed: Mar. 3, 2016

(65) Prior Publication Data

US 2017/0077385 A1 Mar. 16, 2017

Related U.S. Application Data (60) Provisional application No. 62/216,419, filed on Sep. 10, 2015.

(51) Int. Cl.
| | | |
|---|---|---|
| *H01L 41/047* | (2006.01) | |
| *H03H 9/02* | (2006.01) | |
| *H03H 9/13* | (2006.01) | |
| *H03H 9/17* | (2006.01) | |

(52) U.S. Cl.
CPC ....... *H03H 9/02086* (2013.01); *H01L 41/047* (2013.01); *H03H 9/131* (2013.01); *H03H 9/175* (2013.01)

(58) Field of Classification Search
CPC .... H03H 9/02086; H03H 9/131; H03H 9/175; H01L 41/047

USPC .......................................... 310/320, 364, 366
See application file for complete search history.

(56) References Cited

U.S. PATENT DOCUMENTS

| | | | | |
|---|---|---|---|---|
| 2010/0327697 A1* | 12/2010 | Choy | ................ | H03H 9/02118 310/335 |
| 2010/0327994 A1* | 12/2010 | Choy | ................ | H03H 9/02118 333/187 |
| 2012/0218059 A1* | 8/2012 | Burak | ................... | H03H 9/132 333/191 |

OTHER PUBLICATIONS

Co-pending U.S. Appl. No. 14/877,324, filed Oct. 7, 2015.
(Continued)

*Primary Examiner* — Derek Rosenau
(74) *Attorney, Agent, or Firm* — Withrow & Terranova, P.L.L.C.

(57) ABSTRACT

Embodiments of a Bulk Acoustic Wave (BAW) device including a high conductivity electrode are disclosed. In some embodiments, a BAW device includes a piezoelectric layer, a first electrode on a first surface of the piezoelectric layer, and a second electrode on a second surface of the piezoelectric layer opposite the first electrode. The second electrode includes a first metal layer and a second metal layer. The second metal layer is on the second surface of the piezoelectric layer, and the first metal layer is over a surface of the second metal layer opposite the piezoelectric layer, where the first metal layer is separated from the second metal layer by an air gap. By including the air gap, the thickness of the first metal layer (e.g., a high conductivity layer) can be increased to thereby increase the electrical conductivity of the second electrode while maintaining the performance of the BAW device.

20 Claims, 8 Drawing Sheets

(56) References Cited

OTHER PUBLICATIONS

Yen, Ting-Ta et al., "High-Q Capacitive-Piezoelectric ALN Lamb Wave Resonators," Proceedings of the IEEE International Conference on Micro Electro Mechanical Systems (MEMS), MEMS 2013, Taipei, Taiwan, Jan. 20-24, 2013, IEEE, pp. 114-117.

* cited by examiner

AIR GAP IN BAW TOP METAL STACK FOR REDUCED RESISTIVE AND ACOUSTIC LOSS

RELATED APPLICATIONS

This application claims the benefit of provisional patent application Ser. No. 62/216,419, filed Sep. 10, 2015, the disclosure of which is hereby incorporated herein by reference in its entirety.

FIELD OF THE DISCLOSURE

The present disclosure relates to a Bulk Acoustic Wave (BAW) resonator.

BACKGROUND

Due to, among other things, their small size, high quality factor (Q) values, and very low insertion losses at microwave frequencies, particularly those above 1.5 Gigahertz (GHz), Bulk Acoustic Wave (BAW) filters have become the filter of choice for many modern wireless applications. In particular, BAW filters are the filter of choice for many 3$^{rd}$ Generation (3G) and 4$^{th}$ Generation (4G) wireless devices. For instance, virtually all Long Term Evolution (LTE) compatible mobile devices operating in LTE frequency bands above 1.9 GHz utilize BAW filters. For mobile devices, the low insertion loss of the BAW filter provides many advantages such as, e.g., improved battery life, compensation for higher losses associated with the need to support many frequency bands in a single mobile device, etc.

Figure 1:
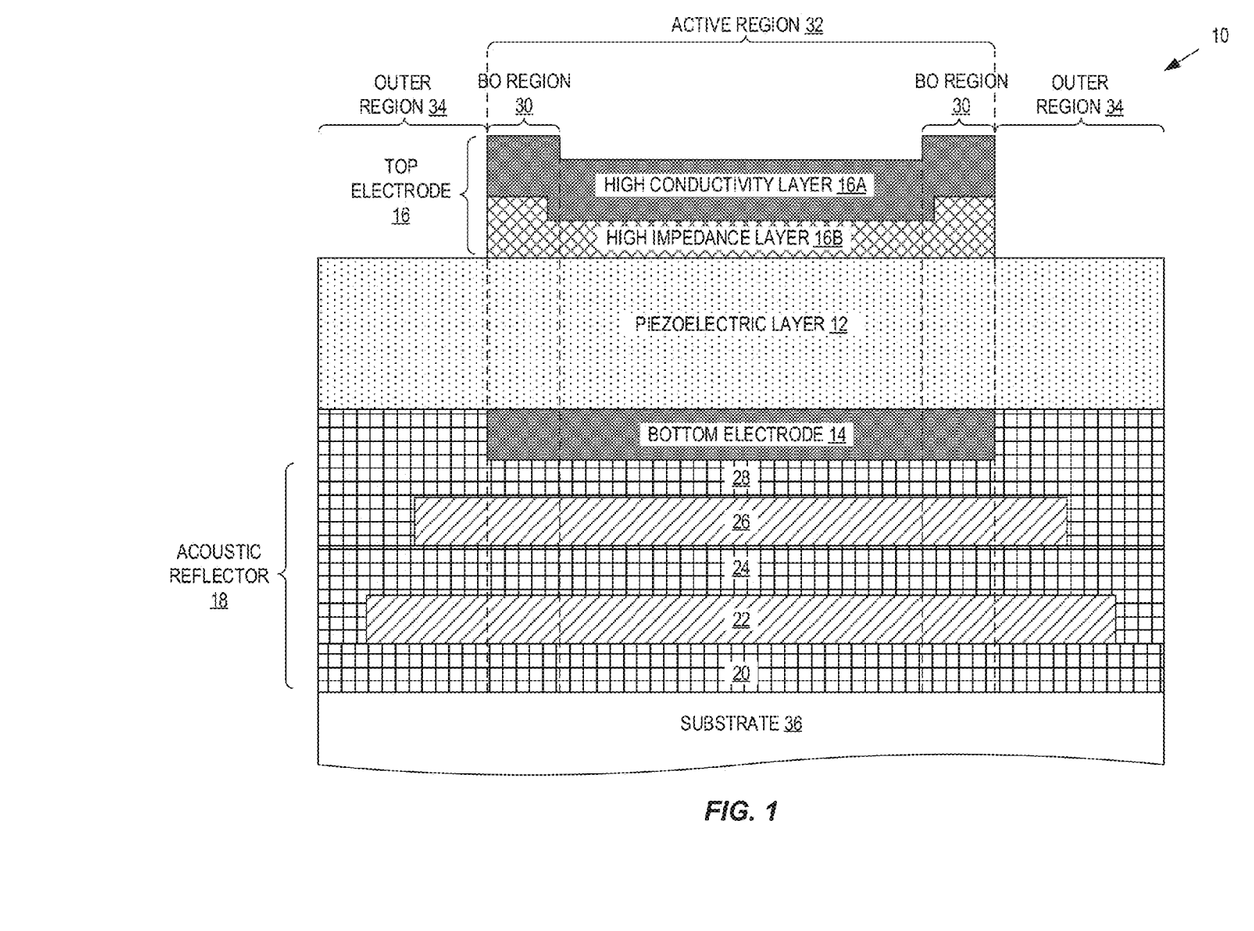
FIG. 1 illustrates a conventional Bulk Acoustic Wave (BAW) resonator.
Figure 2:
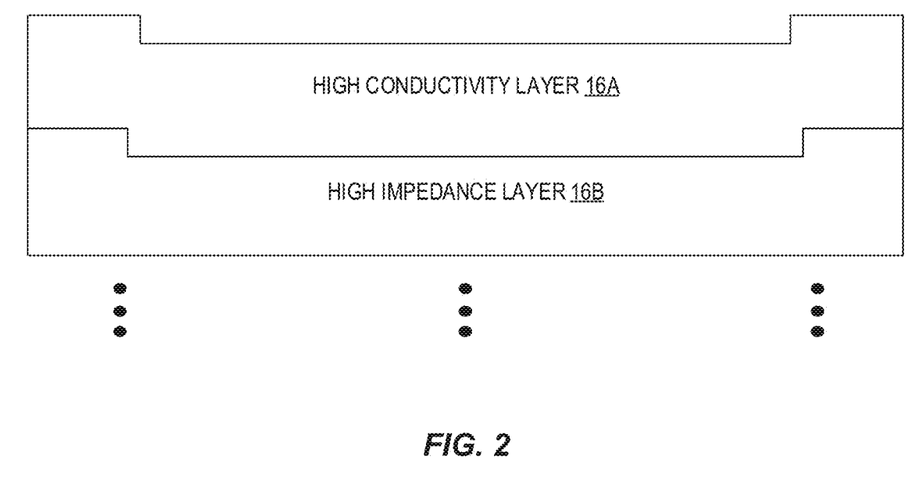
FIG. 2 is a magnified view of the top electrode of the BAW resonator of FIG. 1.

One example of a conventional BAW resonator 10 is illustrated in FIG. 1. In this example, the BAW resonator 10 is, in particular, a Solidly Mounted Resonator (SMR) type BAW resonator 10. As illustrated, the BAW resonator 10 includes a piezoelectric layer 12 (which is sometimes referred to as a piezoelectric plate) between a bottom electrode 14 and a top electrode 16. In this example, the top electrode 16 includes a high (electrical) conductivity layer 16A and a high (acoustic) impedance layer 16B. An enlarged illustration of the top electrode 16 is illustrated in FIG. 2. Since the BAW resonator 10 is a SMR type BAW resonator 10, the BAW resonator 10 also includes an acoustic reflector 18 (e.g., a Bragg reflector) that includes layers 20-28 of alternating high and low acoustic impedance. In this example, the BAW resonator 10 also includes a Border (BO) ring around the periphery of the top electrode 16 within what is referred to herein as a BO region 30 of the BAW resonator 10. The BO region 30 is the peripheral region of an active region 32 of the BAW resonator 10. As used herein, the active region 32 of the BAW resonator 10 is the region of the BAW resonator 10 that is electrically driven. An outer region 34 of the BAW resonator 10 is the region of the BAW resonator 10 that is outside of the active region 32.

In operation, acoustic waves in the piezoelectric layer 12 within the active region 32 of the BAW resonator 10 are excited by an electrical signal applied to the bottom and top electrodes 14 and 16. The active region 32 is the region of the BAW resonator 10 that is electrically driven. In other words, the active region 32 is the region of the BAW resonator 10 consisting of, in this example, the bottom electrode 14, the top electrode 16, the portion of the piezoelectric layer 12 between the bottom and top electrodes 14 and 16, and the portion of the acoustic reflector 18 below the bottom electrode 14. Conversely, the outer region 34 of the BAW resonator 10 is a region of the BAW resonator 10 that is not electrically driven (i.e., the area outside of the active region 32). The frequency at which resonance of the acoustic waves occurs is a function of the thickness of the piezoelectric layer 12 and the mass of the bottom and top electrodes 14 and 16. At high frequencies (e.g., greater than 1.5 GHz), the thickness of the piezoelectric layer 12 is only micrometers thick and, as such, the BAW resonator 10 is fabricated using thin-film techniques.

Ideally, in order to achieve a high Q value, the mechanical energy should be contained, or trapped, within the active region 32 of the BAW resonator 10. The acoustic reflector 18 operates to prevent acoustic waves from leaking longitudinally, or vertically, from the BAW resonator 10 into a substrate 36. Notably, in a Film Bulk Acoustic Resonator (FBAR) type BAW resonator, an air cavity is used instead of the acoustic reflector 18, where the air cavity likewise prevents acoustic waves from escaping into the substrate 36.

One issue that arises with the conventional BAW resonator 10 of FIG. 1 is that thickening of the top electrode 16, and in particular the high conductivity layer 16A, is desirable in order to gain conductivity; however, thickening of the top electrode 16, and in particular the high conductivity layer 16A, changes the characteristics of the BAW resonator 10 and degrades the performance of the BAW resonator 10. Thickening of the top electrode 16 results in mass loading of the BAW resonator 10, which in turn changes the characteristics (e.g., resonant frequency) of the BAW resonator 10. Additionally, thickening of the top electrode 16 drives acoustic energy into the highly conductivity layer 16A (e.g., Aluminum (Al)), which can be acoustically lossly and drive down the Q factor of the BAW resonator 10. Finally, thickening of top electrode metals can also change acoustic wave confinement which can drop Q factor.

In light of the discussion above, there is a need for a BAW resonator architecture that provides improved metal electrode conductivity while avoiding the issues described above.

SUMMARY

Embodiments of a Bulk Acoustic Wave (BAW) device including a high conductivity electrode are disclosed. In some embodiments, a BAW device includes a piezoelectric layer, a first electrode on a first surface of the piezoelectric layer, and a second electrode on a second surface of the piezoelectric layer opposite the first electrode. The second electrode includes a first metal layer and a second metal layer. The second metal layer is on the second surface of the piezoelectric layer, and the first metal layer is over a surface of the second metal layer opposite the piezoelectric layer, where the first metal layer is separated from the second metal layer by an air gap. By including the air gap in the second electrode, the thickness of the first metal layer (e.g., a high conductivity layer) can be increased to thereby increase the electrical conductivity of the second electrode while maintaining the performance (e.g., quality factor (Q)) of the BAW device.

In some embodiments, the thickness of the air gap separating the first metal layer from the second metal layer is in a range of and including 5 nanometers (nm) to 500 nm. In other embodiments, the thickness of the air gap separating the first metal layer from the second metal layer is in a range of and including 5 nm to 200 nm. In other embodiments, the thickness of the air gap separating the first metal layer from the second metal layer is in a range of and including 5 nm to 100 nm. In other embodiments, the thickness of the air gap separating the first metal layer from the second metal layer is in a range of and including 10 nm to 200 nm. In other embodiments, the thickness of the air gap separating the first metal layer from the second metal layer is in a range of and including 10 nm to 100 nm.

In some embodiments, the first metal layer is a high electrical conductivity layer with resistivity $<7 \times 10^{-8}$ Ohm·meter or conductivity $>1.43 \times 10^7$ S/m. Further, in some embodiments, the thickness of the first metal layer is greater than or equal to 50 nm. In some embodiments, the first metal layer includes one or more layers of a metal material, where the metal material is Aluminum (Al), Aluminum Copper (AlCu), Copper (Cu), Gold (Au), Silver (Ag), or Molybdenum (Mo). In some embodiments, the first metal layer includes two or more layers of two or more metal materials, where the two or more metal materials include at least one of Al and AlCu.

In some embodiments, the second metal layer is a high acoustic impedance layer having an acoustic impedance that is greater than 34 MRays. In other embodiments, the second metal layer is a low acoustic loss layer which has an acoustic loss that is less than that of Al or AlCu.

In some embodiments, the second metal layer includes one or more layers of Tungsten (W). In other embodiments, the second metal layer includes one or more layers of a metal material, where the metal material is Tantalum (Ta), Rhenium (Re), Niobium (Nb), or Molybdenum (Mo). In other embodiments, the second metal layer includes one or more layers of a metal material, where the metal material is Titanium (Ti), Zirconium (Zr), Hafnium (Hf), Vanadium (V), Chromium (Cr), Ruthenium (Ru), Osmium (Os), Rhodium (Rh), or Iridium (Ir). In other embodiments, the second metal layer includes two or more layers of two or more different materials, where the two or more different materials include at least one of Ta, Re, Nb, and Mo. In other embodiments, the second metal layer includes two or more layers of two or more different materials, where the two or more different materials include at least one of Ti, Zr, Hf, V, Cr, Ru, Os, Rh, and Ir.

In some embodiments, the air gap separates the first metal layer from the second metal layer within the active region of the BAW device.

In some embodiments, the air gap separates the first metal layer from the second metal layer over an entirety of the active region of the BAW device.

In some embodiments, the first metal layer is anchored, directly or indirectly, to the piezoelectric layer in an outer region of the BAW device.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

Quality factor (Q) values of Bulk Acoustic Wave (BAW) resonators based on, e.g., Aluminum Nitride (AlN) are typically limited by metal electrode loss and device geometries. Additionally, conductivity of metal electrodes for BAW resonators is also limited since adding additional metal mass loads the device and shifts the frequency out of the desired range. To solve these problems, embodiments of a BAW resonator are disclosed herein that include an air gap between the high impedance layer and the high conductivity layer of the electrode. This air gap allows (i) acoustic energy to be kept out of the high conductivity layer to thereby reduce acoustic loss and (ii) thickening of the highly conductive layer to thereby significantly reduce resistive loss. Since the acoustic wave is terminated at the high impedance layer/air interface, there is no mass loading due to the high conductivity layer and, as such, the device frequency can be maintained.

Figure 3:
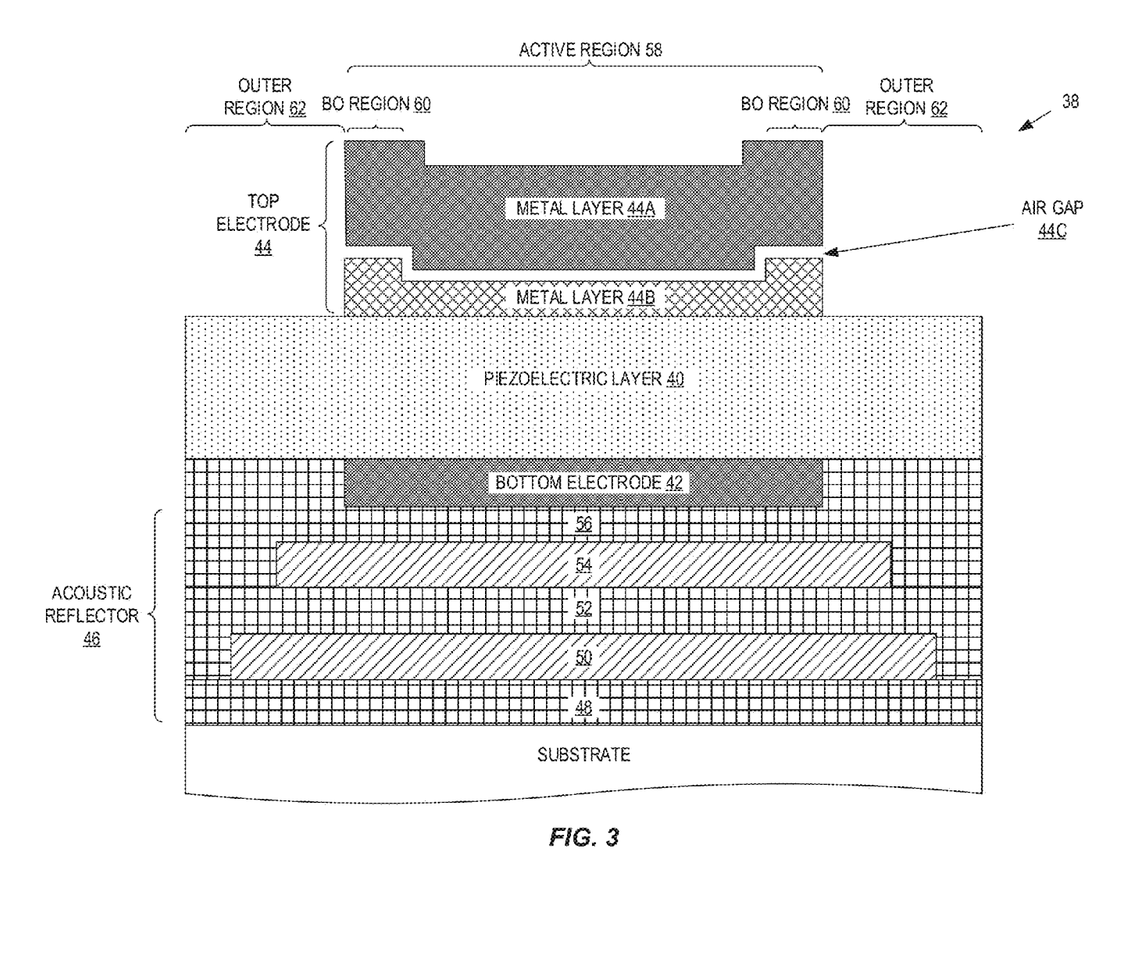
FIG. 3 illustrates a BAW resonator including an air gap between adjacent metal layers within an electrode of the BAW resonator according to some embodiments of the present disclosure.

In this regard, embodiments of a BAW resonator are disclosed in which an air gap is included between adjacent metal layers (e.g., a high conductivity metal layer and a high impedance or low loss metal layer) of an electrode (e.g., a top electrode) of the BAW resonator. One example of a BAW resonator 38 according to embodiments of the present disclosure is illustrated in FIG. 3. As illustrated, the BAW resonator 38 includes a piezoelectric layer 40 (which is sometimes referred to as a piezoelectric plate). The piezoelectric layer 40 may be any suitable type of piezoelectric material such as, for example, AlN or Zinc Oxide (ZnO). Further, the piezoelectric layer 40 may be a single layer of piezoelectric material or may include multiple sublayers of the same or different piezoelectric materials.

The BAW resonator 38 further includes a bottom electrode 42 on a bottom surface of the piezoelectric layer 40 and a top electrode 44 on a top surface of the piezoelectric layer 40 opposite the bottom electrode 42. The bottom electrode 42 includes one or more layers of the same or different metal layers (e.g., a layer of Tungsten (W) on the bottom surface of the piezoelectric layer 40 and a layer of Aluminum (Al) or Aluminum Copper (AlCu) on the bottom surface of the layer of W opposite the piezoelectric layer 40).

Figure 4:
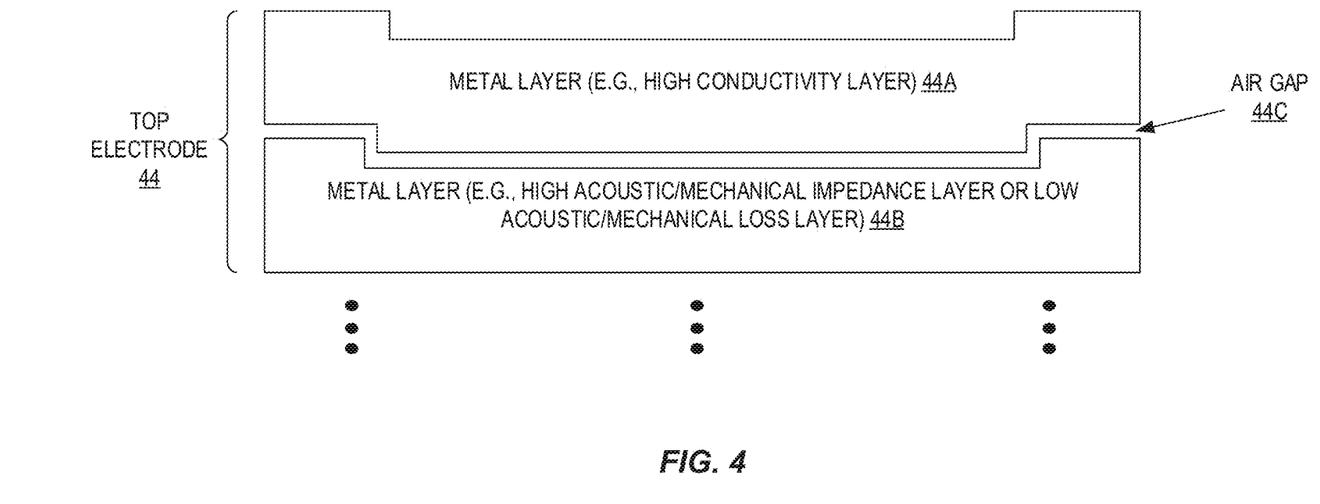
FIG. 4 is a magnified view of the top electrode of the BAW resonator including the air gap according to some embodiments of the present disclosure.

As illustrated in FIG. 3 and further illustrated in FIG. 4, the top electrode 44 includes a first metal layer 44A and a second metal layer 44B separated by an air gap 44C. In some embodiments, the first metal layer 44A is a high (electrical) conductivity metal layer (i.e., a layer with resistivity $<7\times10^{-8}$ Ohm·meter or conductivity $>1.43\times10^{7}$ S/m) that includes one or more layers of the same or different high conductivity metals (e.g., Al, AlCu, Copper (Cu), Gold (Au), Silver (Ag), or Molybdenum (Mo)), and the second metal layer 44B is a high (acoustic) impedance layer and/or a low acoustic/mechanical loss layer including one or more layers of the same or different metals (e.g., a refractory metal such as, e.g., Tantalum (Ta), Rhenium (Re), Niobium (Nb), or Molybdenum (Mo); or, based on a wider definition of refractory metal, Titanium (Ti), Zirconium (Zr), Hafnium (Hf), Vanadium (V), Chromium (Cr), Ruthenium (Ru), Osmium (Os), Rhodium (Rh), or Iridium (Ir)). In some embodiments, the second metal layer 44B is has an acoustic impedance that is greater than 34 MRays. In some embodiments, the second metal layer 44B has an acoustic loss that is less than that of Al or AlCu. Further, in some embodiments, the first metal layer 44A has a thickness of greater than or equal to 50 nanometers (nm). The thickness of the second metal layer 44B may vary based on, e.g., a desired resonant frequency of the BAW resonator 38. For example, the second metal layer 44B may be utilized as a trimming layer for fine tuning the resonant frequency of the BAW resonator 38 to a desired resonant frequency. In some embodiments, the thickness of the second metal layer 44B is greater than 5 nm.

The air gap 44C is a relatively thin air gap. In some embodiments, the air gap 44C has a thickness in a range of and including 5 nm to 500 nm. In some embodiments, the air gap 44C has a thickness in a range of and including 5 nm to 200 nm. In other embodiments, the air gap 44C has a thickness in a range of and including 5 to 100 nm. In other embodiments, the air gap 44C has a thickness in a range of and including 10 nm to 200 nm. In other embodiments, the air gap 44C has a thickness in a range of and including 10 nm to 100 nm. Further, the thickness of the air gap 44C may depend on the desired amount of electromechanical coupling. In general, the electromechanical coupling decreases as the thickness of the air gap 44C increases. Further, the minimum thickness of the air gap 44C may be greater than the maximum deflection of the piezoelectric layer 40 during operation. In other words, the thickness of the air gap 44C should be great enough that the second metal layer 44B does not bump into the first metal layer 44A when vibrating during operation.

By including the air gap 44C, the acoustic layers of the BAW resonator 38 terminate at the interface between the air gap 44C and the second metal layer 44B. As such, unlike the conventional BAW resonator 10 of FIG. 1, the thickness of the first metal layer 44A can be increased (thereby increasing electrical conductivity) without increasing mass loading or decreasing the performance (e.g., the Q) of the BAW resonator 38. Further, by including the air gap 44C between the second metal layer 44B and the first metal layer 44A (as opposed to between the piezoelectric layer 40 and the second metal layer 44B), a number of additional advantages are provided. These advantages include, e.g., the ability to use the second metal layer 44B for frequency trimming, protection of the surface of the piezoelectric layer 40 by the second metal layer 44B, the ability to use known Border (BO) ring structures for high confinement, such as that described in U.S. patent application Ser. No. 14/877,324 entitled BAW RESONATOR HAVING MULTI-LAYER ELECTRODE AND BO RING CLOSE TO PIEZOELECTRIC LAYER, which was filed on Oct. 7, 2015 and is hereby incorporated herein by reference in its entirety.

In the example of FIG. 3, the BAW resonator 38 is a Solidly Mounted Resonator (SMR) type BAW resonator and, as such, the BAW resonator 38 also includes an acoustic reflector 46 (e.g., a Bragg reflector) that includes multiple alternating layers 48-56 of alternating materials with varying acoustic impedance. In one example, the layers 48-56 are alternating layers of Silicon Dioxide ($SiO_2$) and W. Note, however, that the present disclosure is equally applicable to a Film Bulk Acoustic Resonator (FBAR) type BAW resonator in which an air cavity is used in place of the acoustic reflector 46. Further, while in the example of FIG. 3 the air gap 44C is included in the top electrode 44, a similar air gap may be additionally or alternatively included in the bottom electrode 42.

The BAW resonator 38 also includes a Border (BO) ring, which in this example, is part of the second metal layer 44B of the top electrode 44. The BO is a thicker "ring" or "frame" that is, in this example, part of the second metal layer 44B around the periphery of the second metal layer 44B (and thus around a periphery of an active region 58 of the BAW resonator 38). Notably, the region in which the BO ring is located is referred to herein as a BO region 60.

Notably, as used herein, the active region 58 is the region of the BAW resonator 38 that is electrically driven, which in the example of FIG. 3 is the region consisting of the bottom electrode 42, the top electrode 44, the portion of the piezoelectric layer 40 between the bottom and top electrodes 42 and 44, and the portion of the acoustic reflector 46 beneath the bottom electrode 42. An outer region 62 is the region of the BAW resonator 38 that is not electrically driven or, in other words, the region of the BAW resonator 38 that is outside of the active region 58. Again, the BO region 60 is the region in which the BO ring is located.

Figure 5:
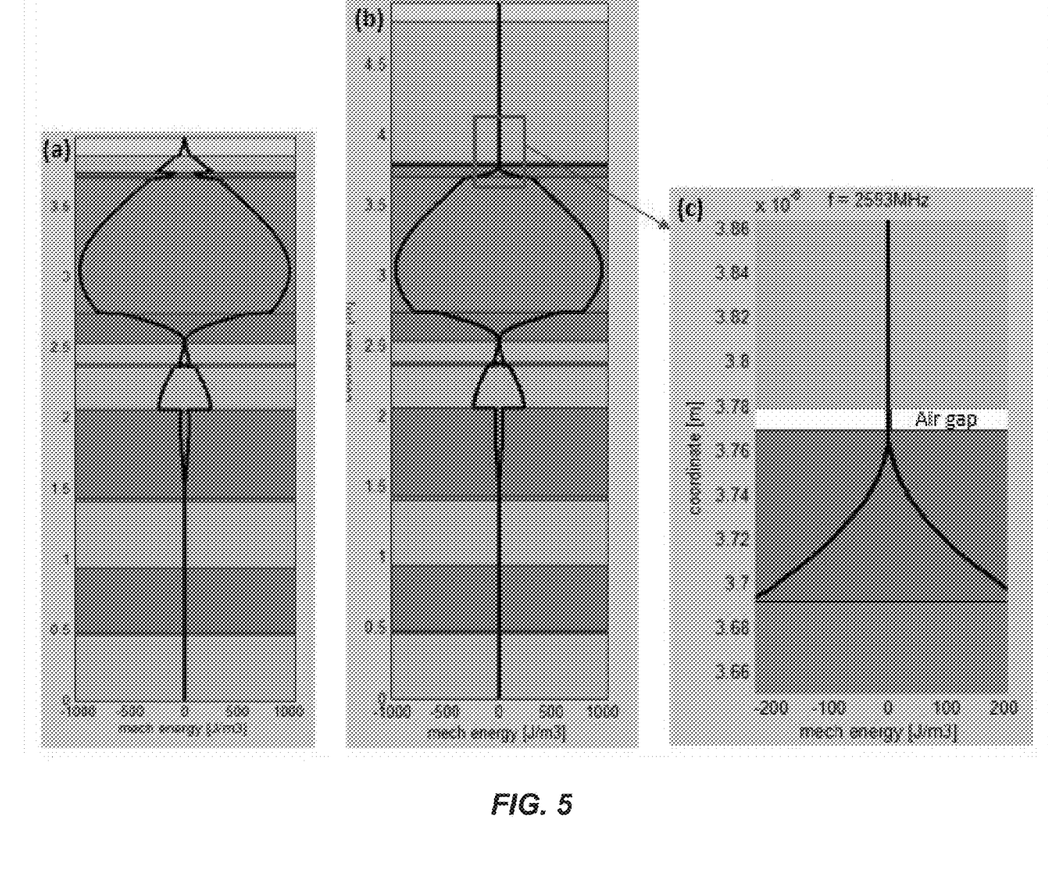
FIG. 5 illustrates a simulation of an energy landscape for (a) the traditional/conventional BAW resonator of FIG. 1 as compared to (b) one example implementation of the BAW resonator of FIG. 3.

FIG. 5 illustrates a simulation of an energy landscape for (a) the traditional/conventional SMR BAW resonator 10 of FIG. 1 as compared to (b) one example implementation of the SMR BAW resonator 38 of FIG. 3. Illustration (c) in FIG. 5 is a zoomed in image of the energy landscape of the SMR BAW resonator 38 of FIG. 3 near the air gap 44C. As can be seen from FIG. 5, energy loss in the BAW resonator 38 is improved as compared to that of the conventional BAW resonator 10 since the acoustic wave is terminated at the ultra-high impedance mismatch interface (i.e., the interface between the air gap 44C and the second metal layer 44B). Therefore, there is no acoustic energy in the first metal layer 44A, which is considered to be lossy.

Also, it should be noted that, in the BAW resonator 38, acoustic confinement can be maintained as the top electrode 44 does not change the acoustic dispersion.

Figure 6:
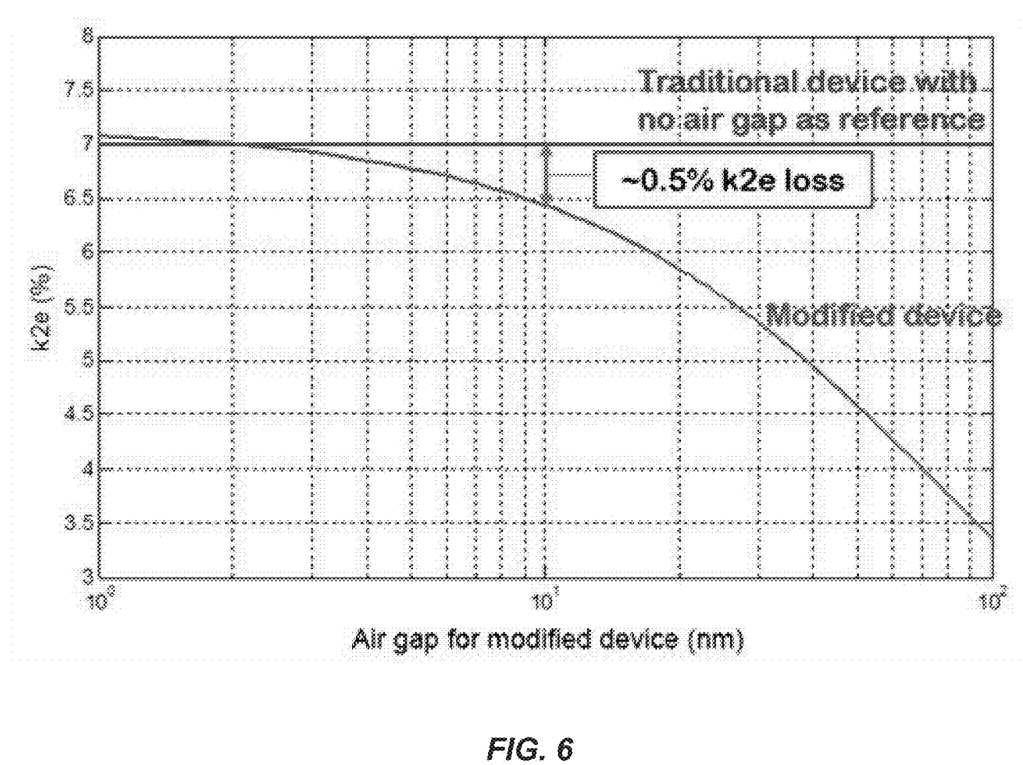
FIG. 6 illustrates modeled resonator coupling (i.e., overall electromechanical coupling) of one example implementation of the BAW resonator of FIG. 3 as compared to the conventional BAW resonator of FIG. 1 as a function of the thickness, or distance, of the air gap.

FIG. 6 illustrates modeled resonator coupling (i.e., overall electromechanical coupling) of one example implementation of the BAW resonator 38 (which includes the air gap 44C) as compared to the BAW resonator 10 (which does not include an air gap) as a function of the thickness, or distance, of the air gap 44C. As illustrated, when the thickness of the air gap 44C becomes larger (i.e., increases), the overall electromechanical coupling (k2e) of the BAW resonator 38 drops (i.e., decreases) due to the degraded capacitive coupling of the electrical field to the piezoelectric layer 40. Considering the use of advanced piezoelectric materials to gain back in coupling and the potential gain in Q and conductivity due to the use of the air gap 44C, this loss in electromechanical coupling would not be detrimental.

Figure 7A:
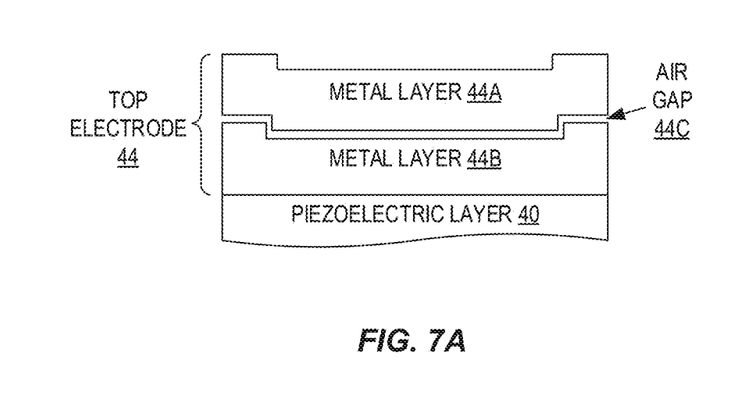
FIGS. 7A and 7B illustrate a comparison of the electrode including the air gap between adjacent metal layers and an electrode in which an air gap is located between the electrode and the piezoelectric layer.
Figure 7B:
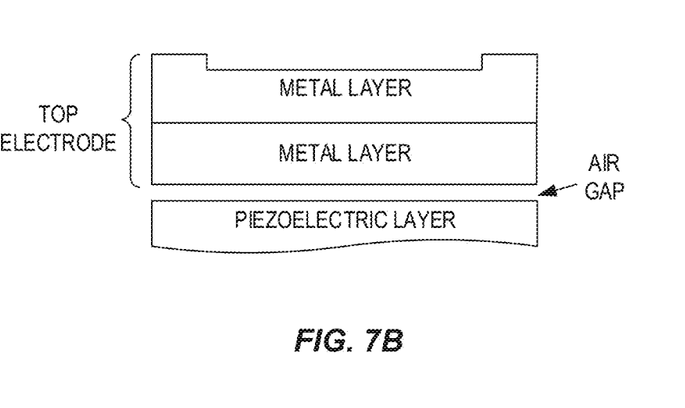

It is important to note that the location of the air gap 44C between the first and second metal layers 44A and 44B, as opposed to between the second metal layer 44B and the piezoelectric layer 40, provide numerous advantages. These two air gap locations are illustrated in FIGS. 7A and 7B, respectively. The location of the air gap 44C between the first and second metal layers 44A and 44B as illustrated in FIG. 7A (and as described above) provides the following advantages:

Trimming on frequency is possible. After processing the second metal layer 44B (e.g., a W layer), frequency trimming may be done on the second metal layer 44B or, alternatively, by adding an additional layer (e.g., an AlN layer) on top of the second metal layer 44B to reduce sensitivity.

Protection of the surface of the piezoelectric layer 40 (which may be AlN). The BAW resonator 38 is sensitive to the surface of the piezoelectric layer 40. By locating the air gap 44C between the first and second metal layers 44A and 44B, the surface of the piezoelectric layer 40 is protected.

BO definition is easily done. Known BO structures for high confinement can be used.

Higher k2e. Due to the presence of the second metal layer 44B (e.g., a W layer), electromechanical coupling (k2e) is naturally higher.

In contrast, the location of the air gap between the piezoelectric layer and the top electrode as illustrated in FIG. 7B has the following disadvantages:

Trimming on frequency is not possible. Frequency trimming would need to be done solely based on metrology. The accuracy of the resulting frequency of the BAW resonator would be poor.

No protection of the surface of the piezoelectric layer (which may be AlN). The surface of the piezoelectric layer could be damaged by air gap processing (i.e., by processing steps used to create the air gap).

BO not done in the lower metal layer (which may be W). A new BO technique would need to be developed.

Lack of high impedance material on top of the piezoelectric layer (which may be AlN) limits k2e. Piezoelectric layer thickness needs to increase, which increases device size significantly.

Figure 8:
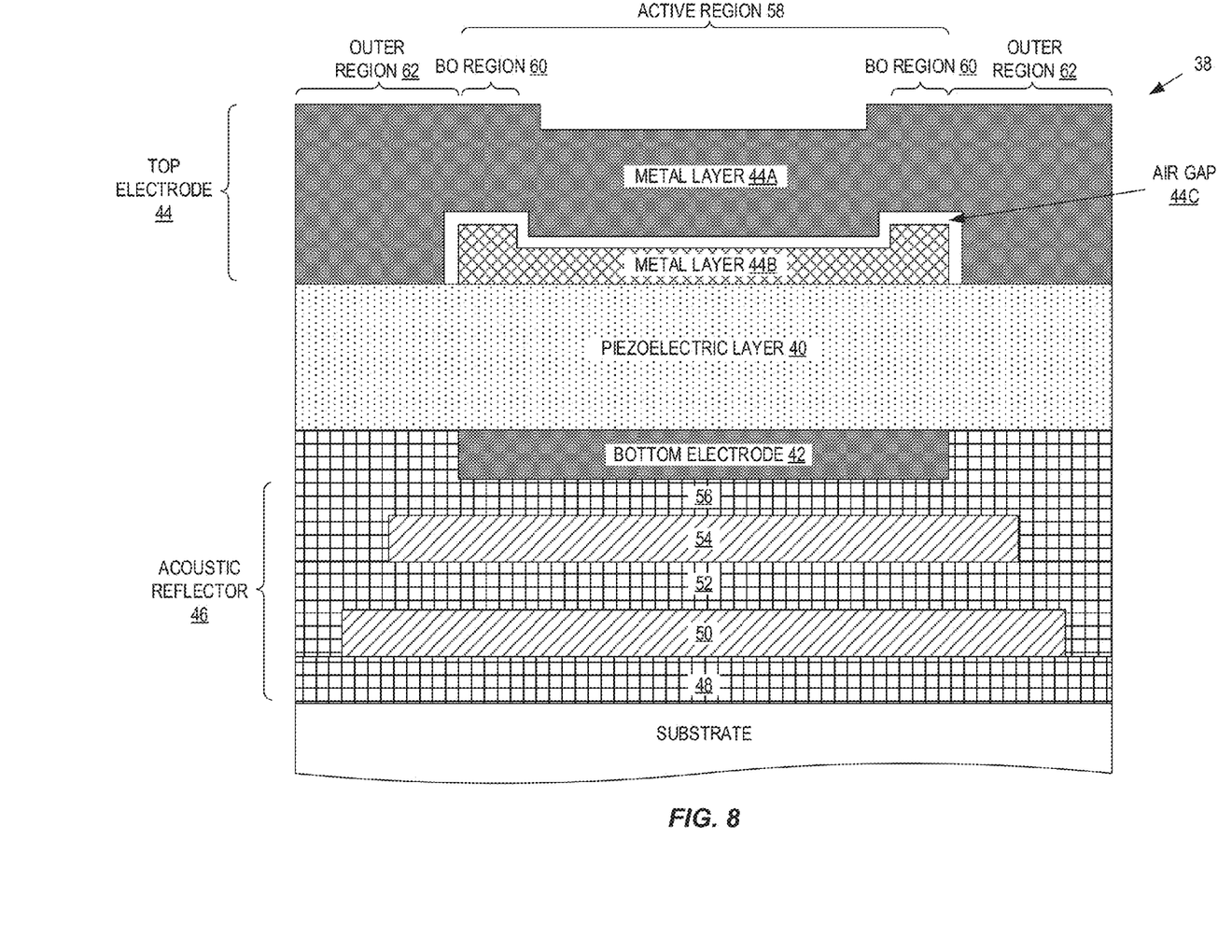
FIG. 8 illustrates one example of the BAW resonator of FIG. 3 in which the top metal layer of the top electrode is anchored to the BAW resonator within an outer region of the BAW resonator.

In the example of FIG. 3, the manner in which the first metal layer 44A is anchored onto the BAW resonator 38 is not explicitly shown. The first metal layer 44A may be anchored to (i.e., connected to) the remaining structure of the BAW resonator 38 using any desired technique. In some embodiments, the air gap 44C and the first metal layer 44A are formed such that the air gap 44C extends over the active region 58 of the BAW resonator 38 and the first metal layer 44A is anchored to the BAW resonator 38 (e.g., anchored to the piezoelectric layer 40) in the outer region 62. One example of the BAW resonator 38 explicitly showing anchoring of the first metal layer 44A is shown in FIG. 8. In this example, the first metal layer 44A extends laterally outward from the active region 58 into the outer region 62 and onto the top surface of the piezoelectric layer 40. In this example, within the outer region 62, the first metal layer 44A is on (e.g., directly on) the surface of the piezoelectric layer 40; however, in some embodiments, one or more additional material layers may be between the piezoelectric layer 40 and the first metal layer 44A in the outer region 62. The air gap 44C is maintained between the first and second metal layers 44A and 44B. Note that FIG. 8 is only an example. Other techniques may be used to anchor the first metal layer 44A onto the BAW resonator 38.

Those skilled in the art will recognize improvements and modifications to the preferred embodiments of the present disclosure. All such improvements and modifications are considered within the scope of the concepts disclosed herein and the claims that follow.

What is claimed is:
1. A Bulk Acoustic Wave (BAW) device, comprising:
a piezoelectric layer;

a first electrode on a first surface of the piezoelectric layer; and a second electrode on a second surface of the piezoelectric layer opposite the first electrode, the second electrode comprising a first metal layer and a second metal layer, wherein the second metal layer is on the second surface of the piezoelectric layer; and the first metal layer is over a surface of the second metal layer opposite the piezoelectric layer, the first metal layer being separated from the second metal layer by an air gap.

2. The BAW device of claim 1 wherein a thickness of the air gap separating the first metal layer from the second metal layer is in a range of and including 5 nanometers (nm) to 500 nm.

3. The BAW device of claim 1 wherein a thickness of the air gap separating the first metal layer from the second metal layer is in a range of and including 5 nanometers (nm) to 200 nm.

4. The BAW device of claim 1 wherein a thickness of the air gap separating the first metal layer from the second metal layer is in a range of and including 5 nanometers (nm) to 100 nm.

5. The BAW device of claim 1 wherein a thickness of the air gap separating the first metal layer from the second metal layer is in a range of and including 10 nanometers (nm) to 200 nm.

6. The BAW device of claim 1 wherein a thickness of the air gap separating the first metal layer from the second metal layer is in a range of and including 10 nanometers (nm) to 100 nm.

7. The BAW device of claim 1 wherein the first metal layer is a high electrical conductivity layer with resistivity $<7 \times 10^{-8}$ Ohm·meter or conductivity $>1.43 \times 10^7$ S/m.

8. The BAW device of claim 7 wherein a thickness of the first metal layer is greater than or equal to 50 nanometers (nm).

9. The BAW device of claim 7 wherein the first metal layer comprises one or more layers of a metal material, the metal material being one of a group consisting of: Aluminum, Copper, Gold, Silver, Molybdenum, and alloys thereof.

10. The BAW device of claim 7 wherein the first metal layer comprises two or more layers of two or more metal materials, the two or more metal materials comprising at least one of a group consisting of: Aluminum and Aluminum Copper.

11. The BAW device of claim 1 wherein the second metal layer is a high acoustic impedance layer having an acoustic impedance that is greater than 34 MRays.

12. The BAW device of claim 1 wherein the second metal layer is a low acoustic loss layer which has an acoustic loss that is less than that of Aluminum or Aluminum Copper.

13. The BAW device of claim 1 wherein the second metal layer comprises one or more layers of Tungsten.

14. The BAW device of claim 1 wherein the second metal layer comprises one or more layers of a metal material, the metal material being one of a group consisting of: Tantalum, Rhenium, Niobium, and Molybdenum.

15. The BAW device of claim 1 wherein the second metal layer comprises one or more layers of a metal material, the metal material being one of a group consisting of: Titanium, Zirconium, Hafnium, Vanadium, Chromium, Ruthenium, Osmium, Rhodium, and Iridium.

16. The BAW device of claim 1 wherein the second metal layer comprises two or more layers of two or more different materials, the two or more different materials comprising at least one of a group consisting of: Tantalum, Rhenium, Niobium, and Molybdenum.

17. The BAW device of claim 1 wherein the second metal layer comprises two or more layers of two or more different materials, the two or more different materials comprising at least one of a group consisting of: Titanium, Zirconium, Hafnium, Vanadium, Chromium, Ruthenium, Osmium, Rhodium, and Iridium.

18. The BAW device of claim 1 wherein the air gap separates the first metal layer from the second metal layer within an active region of the BAW device.

19. The BAW device of claim 1 wherein the air gap separates the first metal layer from the second metal layer over an active region of the BAW device.

20. The BAW device of claim 1 wherein the first metal layer is anchored, directly or indirectly, to the piezoelectric layer in an outer region of the BAW device.

* * * * *